US009166623B1

(12) United States Patent
Bates et al.

(10) Patent No.: US 9,166,623 B1
(45) Date of Patent: Oct. 20, 2015

(54) REED-SOLOMON DECODER

(71) Applicant: PMC-SIERRA US, INC., Sunnyvale, CA (US)

(72) Inventors: Stephen Bates, Canmore (CA); Peter Graumann, Calgary (CA); Phil Northcott, Coquitlam (CA)

(73) Assignee: PMC-Sierra US, Inc., Sunnyvale, CA (US)

( * ) Notice: Subject to any disclaimer, the term of this patent is extended or adjusted under 35 U.S.C. 154(b) by 120 days.

(21) Appl. No.: 13/803,919

(22) Filed: Mar. 14, 2013

(51) Int. Cl.
*H03M 13/00* (2006.01)
*H03M 13/05* (2006.01)
*H03M 13/15* (2006.01)

(52) U.S. Cl.
CPC .......... *H03M 13/05* (2013.01); *H03M 13/1515* (2013.01)

(58) Field of Classification Search
None
See application file for complete search history.

(56) References Cited

U.S. PATENT DOCUMENTS

| | | | | |
|---|---|---|---|---|
| 5,428,628 | A * | 6/1995 | Hassner et al. | 714/759 |
| 6,131,178 | A * | 10/2000 | Fujita et al. | 714/784 |
| 6,308,295 | B1 * | 10/2001 | Sridharan et al. | 714/755 |
| 6,990,624 | B2 * | 1/2006 | Dohmen et al. | 714/785 |
| 7,913,151 | B1 * | 3/2011 | Gorshe | 714/781 |
| 8,020,077 | B1 * | 9/2011 | Gorshe | 714/777 |
| 8,132,081 | B1 * | 3/2012 | Wu | 714/782 |
| 8,335,808 | B2 * | 12/2012 | Shieh | 708/200 |
| 8,397,144 | B1 * | 3/2013 | Norrie et al. | 714/785 |
| 8,413,023 | B2 * | 4/2013 | Ashe et al. | 714/781 |
| 8,601,351 | B2 * | 12/2013 | Wong et al. | 714/782 |
| 2003/0192007 | A1 * | 10/2003 | Miller et al. | 714/782 |
| 2004/0078747 | A1 * | 4/2004 | Miller et al. | 714/782 |
| 2010/0169746 | A1 * | 7/2010 | Karabed et al. | 714/780 |
| 2010/0174954 | A1 * | 7/2010 | Karabed et al. | 714/704 |
| 2010/0174969 | A1 * | 7/2010 | Ashe et al. | 714/781 |
| 2014/0229791 | A1 * | 8/2014 | Langhammer | 714/757 |

OTHER PUBLICATIONS

Lin et al., "Error Control Coding, Chapter 7, Nonbinary BCH decoding, Reed-Solomon Codes, and Decoding Algorithms," Pearson Press, 2004, 39 pages.
Berlekamp, "Nonbinaly BCH Decoding," Institute of Statistics Mimeo Series No. 502, 47 pages, USA.
Vardy et al., "Bit-level soft-decision decoding of Reed-Solomon codes," IEEE Transactions on Communications, vol. 39, No. 3, Mar. 1991, 5 pages, IEEE, USA.
Gross et al., "A VLSI architecture for interpolation in soft-decision list decoding of Reed-Solomon codes," IEEE Workshop on Signal Processing Systems, 2002, 6 pages, IEEE, USA.
Wikipedia,"Reed-Solomon Error Correction Codes," http://en.wikipedia.org/wiki/Reed%E2%80%93Solomon_error_correction, printed on Feb. 4, 2013, 16 pages.

* cited by examiner

*Primary Examiner* — Daniel McMahon
(74) *Attorney, Agent, or Firm* — Dennis R. Haszko

(57) ABSTRACT

A system and method of decoding a Reed-Solomon code using a Reed-Solomon decoder comprising an erasure location selector, multiple syndrome formers and multiple Berlekamp-Massey decoders that share a single error correction unit, and means for selecting a Berlekamp-Massey decoder output as the input to the error correction unit. The method improves the bit error rate performance of the Reed-Solomon decoder compared to known hard-decision and soft-decision Reed-Solomon decoders. The Reed-Solomon decoder also provides hardware area and power savings over more complex Reed-Solomon decoders.

11 Claims, 5 Drawing Sheets

REED-SOLOMON DECODER

FIELD

The present disclosure relates generally to the field of data communications error correction.

BACKGROUND

Information transmitted over, or stored in, a physical medium is susceptible to errors derived from noise and other random processes. Forward error correction ("FEC") is commonly used to improve the bit error rate ("BER") of a communications system. A popular FEC implementation is Reed-Solomon error correction.

A Reed-Solomon error correcting code is also a type of erasure code; that is, bits or values of the received code can be marked as erasures, or error locations known in advance, for the purpose of decoding. While a Reed-Solomon code can correct a certain number of errors, it can correct more erasures. Therefore, if the locations of likely errors are known, then the errors can be marked as erasures, increasing the number of errors that can be corrected.

Specifically, a Reed-Solomon code comprises parameters N, k and m. Each Reed-Solomon codeword consists of N symbols, with each symbol consisting of m bits. The codeword contains k symbols of message data, implying that k<N and that the codeword contains N−k symbols of check or parity data.

It is a defining property of a Reed-Solomon code that the decoder can correct up to N−k/2 symbols in error and detect up to N−k symbols in error. It is yet another property of the code that the decoder can correct up to N−k erasure symbols. Further, a decoder can correct a codeword with A errored symbols and B erased symbols as long as 2A+B≤N−k. Hence, the BER of a received information stream can be improved if the decoder can glean additional information about the locations of errored symbols and mark those symbols as erasures.

A Reed-Solomon decoder that does not take advantage of erasures operates akin to a hard-decision FEC decoder. Hard bits are either 0s or 1s at the input of the decoder. Thus, a hard-decision Reed-Solomon decoder can only correct up to N−k/2 symbols in error.

A classical Reed-Solomon decoder, shown in FIG. 1, comprises three processing stages: a syndrome former, a Berlekamp-Massey (BM) decoder, and an error correction unit. The syndrome former generates syndrome values from the received message. The syndrome values are non-zero if the received message contains errors. The Berlekamp-Massey algorithm uses the syndromes to determine the locations of the errors in the received message. Finally, the error correction unit corrects the identified errors. In the case of a binary message, the error correction is a trivial bit flip; in the general case, an appropriate algorithm, such as the Forney algorithm, generates the error values used for error correction.

A soft-decision Reed-Solomon decoder "softens" the input data by marking likely error locations with erasures. Advances in soft-decision Reed-Solomon decoding can lead to improved BER over known decoding techniques, up to a theoretical BER ceiling defined by the N−k maximum number of correctable erasures.

One known method of soft-decision Reed-Solomon decoding makes use of soft-decision information at the bit-level rather than only at the byte-level (or symbol-level). A Reed-Solomon code is beneficial in a noisy channel that manifests bursts of bit errors. Since the bit errors are localized to one or a few symbols, most codewords are correctable. However, in a memoryless noisy channel that only manifests evenly distributed bit errors, the BER of the conventional Reed-Solomon decoder suffers. This method performs bit-level soft-decision decoding by generating, at the encoder, a linear mapping of a string of bits from a number of symbols. The encoder chooses a recursive generator matrix over a Galois Field of size Nl that interleaves the m bits of each symbol evenly over m codewords. Thus, each symbol is mapped to a coset of bits and each coset is over a Galois Field of size m, ensuring that decisions are bit-level. The decoder applies a maximum likelihood decoding algorithm (soft-decision decoding) first to the received codeword, which comprises interleaved bits, and then to the coset of interleaved bits forming a transmitted symbol.

Another known method of soft-decision Reed-Solomon decoding uses a list decoding algorithm to improve the number of errors that can be corrected in a codeword. A list decoding algorithm produces a list of potential valid received codewords. Using side information, the soft-decision decoder can prune the list of codewords. The Guruswami-Sudan algorithm can correct $n-\sqrt{nk}$ errors and comprises two main steps: interpolating a bivariate polynomial from a list of points corresponding to the received word; and factoring the bivariate polynomial to determine the list of codewords corresponding to these factors. The Koetter-Vardy algorithm extends the Guruswami-Sudan list decoding method so that the decoder is a soft-decision decoder. The Koetter-Vardy "front-end" algorithm translates side-information into multiplicities proportional to the reliability of the points; therefore, the bivariate polynomial is found through a biased interpolation with unequal multiplicities. This biased bivariate interpolation polynomial factors to produce a reduced list of codewords.

Both of these soft-decision decoding methods are relatively complex. The complexity is reflected in the hardware implementation of these methods, which leads to higher power consumption. It is therefore desirable to provide an improved soft-decision Reed-Solomon decoder with a relatively low area and power consumption.

DETAILED DESCRIPTION

Figure 1:
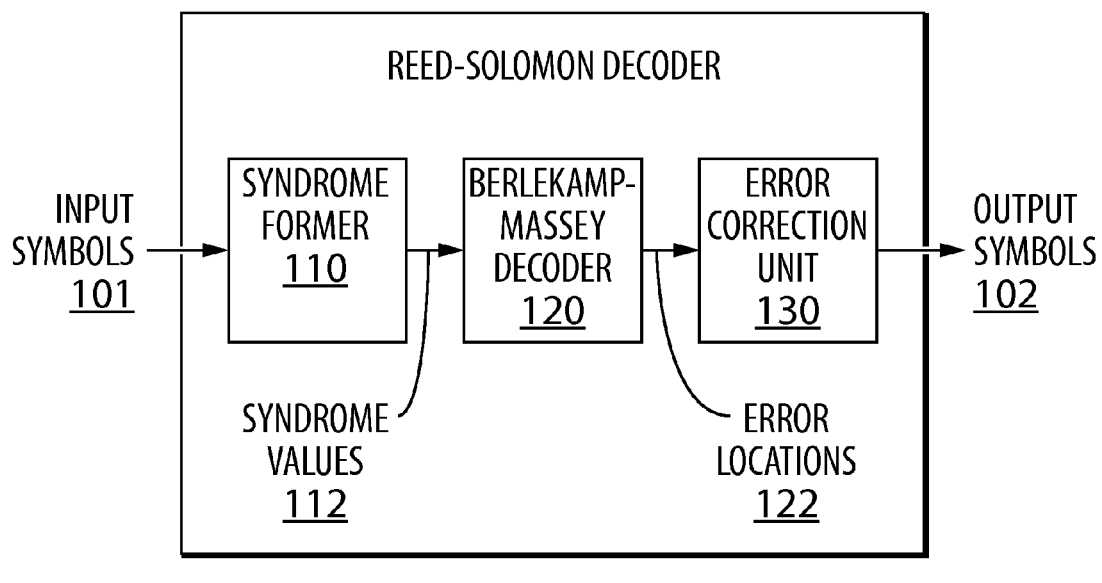
FIG. 1 illustrates a classical Reed-Solomon decoder.

A system and method of decoding a Reed-Solomon code using a Reed-Solomon decoder comprising an erasure location selector, multiple syndrome formers and multiple Berlekamp-Massey decoders that share a single error correction unit, and means for selecting a Berlekamp-Massey decoder output as the input to the error correction unit. The method improves the bit error rate performance of the Reed-Solomon decoder compared to known hard-decision and soft-decision Reed-Solomon decoders. The Reed-Solomon decoder also provides hardware area and power savings over more complex Reed-Solomon decoders.

Embodiments of the present disclosure provide a scalable soft-decision Reed-Solomon decoder comprising a plurality of syndrome formers and a plurality of Berlekamp-Massey decoders ("BM decoders"). In particular, the overall BER performance of the decoder improves as the number of syndrome formers and the number of BM decoders of the scalable soft-decision Reed-Solomon decoder increase. Furthermore, in an embodiment, as the number of syndrome formers and the number of BM decoders increase at a linear rate, the overall area and power consumption of the decoder increases at a sub-linear rate.

In one embodiment, the Reed-Solomon decoder is a "duality" Reed-Solomon decoder comprising two syndrome formers and two BM decoders. Thus, the classical Reed-Solomon decoder is augmented in an example embodiment with additional logic components: a second syndrome former, a second BM decoder, and a Berlekamp-Massey Selector ("BM Selector"). In this embodiment, the Reed-Solomon decoder comprises a first syndrome former configured to produce a first syndrome based on received input symbols; a second syndrome former configured to produce a second syndrome based on the received input symbols and based on estimated erasure locations; first and second Berlekamp-Massey (BM) decoders associated with the first and second syndrome formers, respectively, to receive the first and second syndromes; a single error correction unit associated with the first and second BM decoders; and a decoder output selector configured to select either an output of the first BM decoder or an output of the second BM decoder and to provide the selected output to the single error correction unit for correcting the received input symbols.

In a further embodiment, an erasure location selector provides estimates of erasure locations based on received symbol metrics. In yet a further embodiment the symbol metrics received at the erasure location selector are a measure of Euclidean distance between a symbol and its nearest correct symbol.

In an embodiment, the BM selector operates a multiplexer ("MUX") to provide the selected BM decoder output to the single error correction unit.

In an embodiment of the "duality" Reed-Solomon decoder, the decoding method comprises: generating a first syndrome based on received input symbols at a first syndrome former; generating a second syndrome based on received input symbols and based on estimated erasure locations at a second syndrome former; decoding the first and second syndromes at a first Berlekamp-Massey (BM) decoder and a second BM decoder, respectively; selecting an output of the first BM decoder or an output of the second BM decoder; and correcting the input symbols based on an output of the selected BM decoder, at a single error correction unit.

In another embodiment, the method comprises: receiving an input codeword and symbol metrics; generating erasure locations from the received symbol metrics; providing the erasure locations to the second of the two syndrome formers; generating a first plurality of syndromes from the input codeword at the first syndrome former; generating a second plurality of syndromes from the input codeword and the erasure locations at the second syndrome former; providing the first plurality of syndromes to the first BM decoder and the second plurality of syndromes to the second BM decoder; decoding the first and second plurality of syndromes at each of the two BM decoders; providing an uncorrectable indicator from each of the two BM decoders to a BM selector; selecting one BM decoder, wherein the first BM decoder is selected if the first BM decoder provides a negative uncorrectable indicator and the second BM decoder is selected if the first BM decoder provides a positive uncorrectable indicator; generating a plurality of error location polynomials, wherein each BM decoder generates an unique error location polynomial; and providing one of the plurality of error location polynomials to an error correction unit, wherein the error location polynomial corresponds to the selected BM decoder.

In an example embodiment, the Reed-Solomon decoder comprises a first syndrome former and a first BM decoder corresponding to the first syndrome former, a plurality of additional syndrome formers, and a plurality of additional BM decoders, wherein each BM decoder of the plurality of additional BM decoders corresponds uniquely to a syndrome former of the plurality of additional syndrome formers. In this embodiment, the classical Reed-Solomon decoder is augmented with the plurality of syndrome formers, the plurality of BM decoders, an Erasure Location Selector, a BM Selector and a MUX.

In the example embodiment of the Reed-Solomon decoder, the decoding method comprises: receiving an input codeword and symbol metrics; generating a plurality of unique erasure location vectors from the received symbol metrics, corresponding to the plurality of additional syndrome formers; providing each unique erasure location vector of the plurality of unique erasure location vectors to a corresponding one of the plurality of additional syndrome formers; generating a first unique syndrome from the input codeword, at the first syndrome former; generating a plurality of unique syndromes from the input codeword and the plurality of unique erasure location vectors at the plurality of additional syndrome formers; providing the plurality of unique syndromes to the first BM decoder and the plurality of additional BM decoders; decoding the plurality of unique syndromes at each of the first BM decoder and the plurality of additional BM decoders; providing, to a BM selector, an uncorrectable indicator from each of the first BM decoder and the plurality of additional BM decoders; selecting one BM decoder, wherein the BM decoder selected is the BM decoder corresponding to the smallest number of erasures and that provides a negative uncorrectable indicator; generating a plurality of unique error location polynomials, wherein each BM decoder generates an unique error location polynomial; providing one of the plurality of unique error location polynomials to an error correction unit, wherein the error location polynomial corresponds to the selected BM decoder.

In a further embodiment, the plurality of unique erasure location vectors is ordered by the increasing number of erasures, causing the decoded error location polynomials to be ranked in order of increasing likelihood of including an invalidly marked erasure.

In an embodiment, the BM selector selection method comprises the steps of: providing a plurality of error location polynomials from the plurality of BM decoders to the BM selector, wherein, the plurality of error location polynomials is ordered by increasing number of processed erasures; selecting a BM decoder corresponding to the first correctable error location polynomial from the plurality of ordered error location polynomials; and providing the identity of the selected BM decoder to the MUX.

In another embodiment, the plurality of erasure location vectors is ordered by the Hamming distance of the inputs related to the error location polynomials.

In another embodiment, the plurality of erasure location vectors is ordered by the Euclidan distance of the inputs related to the error location polynomials.

In the present disclosure, the erasure location selector receives symbol metrics of goodness representing the likely locations of errors. Symbol metrics of goodness may also be known as soft-decision information or side-information. In an embodiment, the symbol metric of goodness is the Euclidian distance between the received symbol and its nearest correct symbol. In another embodiment, the symbol metric of goodness is the timing jitter as detected in a Clock and Data Recovery (CDR) circuit.

The Reed-Solomon decoder of the present disclosure achieves improved BER performance over both a classical hard-decision Reed-Solomon decoder and a single soft-decision Reed-Solomon decoder. Furthermore the Reed-Solomon decoder of the present disclosure achieves improved area and power savings over other known soft-decision Reed-Solomon decoders having improved BER performance. The Reed-Solomon decoder of the present disclosure achieves these combined advantages sharing the error correction unit multiple syndrome former and BM decoder engines operating in parallel.

Table 1 shows the sub-linear increase in power and area of two embodiments of the Reed-Solomon decoder of the present disclosure.

| Number of syndrome formers | Number of BM decoders | Relative power and area |
|---|---|---|
| 1 | 1 | 1 |
| 2 | 2 | 1.3 |
| 3 | 3 | 1.6 |

Reference is now made to FIG. 1, which illustrates a classical Reed-Solomon decoder implementation known in the art. Discussion of the embodiments of the present disclosure will refer to terminology defined by the description of the classical Reed-Solomon decoder. A decoder 100 is an open loop system that receives a codeword consisting of input symbols 101. The decoder 100 processes the input symbols 101 in three distinct stages to generate a decoded codeword consisting of output symbols 102. The input symbols 101 may or may not contain errors, and the output symbols 102 may or may not contain errors.

A syndrome former 110 generates a syndrome polynomial, comprising syndrome values 112, from a received codeword. In an implementation, the received codeword is represented as a polynomial, which is constructed from a message polynomial and a generator polynomial according to the following equations:

$$s_r(x) = (p(x) \times x^t) \bmod g(x)$$

$$s(x) = p(x) \times x^t - s_r(x)$$

where s(x) is the transmitted polynomial, p(x) is the message polynomial and g(x) is the generator polynomial. The coefficients of the polynomial represent the symbols of a codeword.

However, the transmitted polynomial, s(x), may be corrupted in transit by an error polynomial e(x) to produce the received polynomial r(x):

$$r(x) = s(x) + e(x)$$

The syndrome former 110 generates syndrome values 112 by evaluating the received polynomial, r(x), at powers of a chosen primitive root, α, where α is a primitive root of the Galois Field, according to the powers of the generator polynomial.

Therefore, if the syndrome values 112 are zero, no error is present in the received codeword and further decoding is not necessary. If the syndrome values 112 are non-zero, the Reed-Solomon decoder 100 deduces that one or more errors were transmitted and proceeds to locate the error locations at a BM decoder 120 and correct the identified errors at a error correction unit 130.

The locations of errors 122 are encoded into the non-zero syndrome values 112. The BM decoder 120 iteratively processes the syndrome values 112 to determine the locations of errors 122. The relationship between the syndrome values 112 and the coefficients of the error locator polynomial satisfies the following equation:

$$S_{i+v} + \Lambda_1 S_{i+v-1} + \ldots + \Lambda_{v-1} S_{i+1} + \Lambda_v S_i = 0.$$

Therefore, by iterating the error locator polynomial to satisfy the above equation, the BM decoder 120 identifies the correct error locator polynomial, Λ(x). The BM decoder 120 factors the error locator polynomial such that the roots of the error locator polynomial, $X_1^{-1}, \ldots, X_v^{-1}$ represent the reciprocals of the error locations 122: $X_j = \alpha^{i_j}$.

The error locator polynomial and the error locations 122 are passed to the error correction unit 130 where an appropriate method, such as a method based on the Forney algorithm, is used to calculate the error values and to correct the received codeword.

In an embodiment where the error correction unit 130 calculates the error values according to the Forney algorithm, the error correction unit 130 first calculates an error evaluator polynomial: $\Omega(x) = S(x)\Lambda(x) \pmod{x^{2t}}$. The error correction unit 130 then evaluates the error values with the error evaluator polynomial and the formal derivative of the error locator polynomial:

$$e_j = -\frac{\Omega(X_j^{-1})}{\Lambda'(X_j^{-1})}.$$

If the received codeword contains input symbols 101 having a number of errors exceeding a threshold, the decoded codeword will contain some output symbols 102 of erroneous value. In the classical Reed-Solomon decoder 100, the threshold is equal to half of the minimum distance of the Reed-Solomon code. That is, N−k/2, where N is the total number of symbols in the codeword and k is the number of message symbols in the codeword. Therefore, a Reed-Solomon decoder can correct up to N−k/2 symbols in error.

If the locations of errors in the input symbols 101 are already known to the decoder, then the locations of the errors can be marked as erasures. A Reed-Solomon decoder can correct a codeword with N−k erasure symbols. Furthermore, a Reed-Solomon decoder can correct a codeword with combined A errored symbols and B erased symbols as long as the equality 2A+B≤N−k is satisfied.

Figure 2:
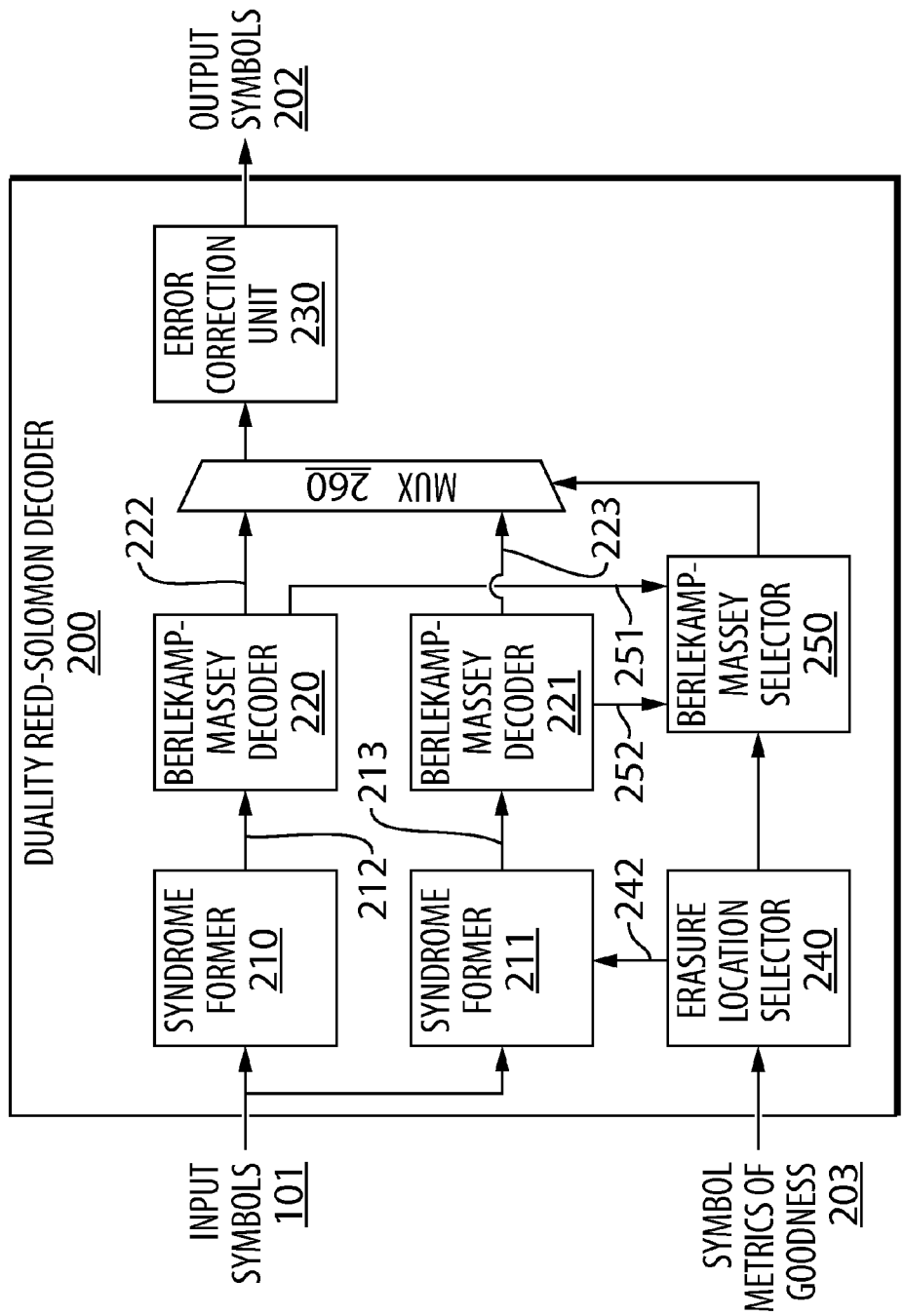
FIG. 2 illustrates a duality Reed-Solomon decoder according to an embodiment of the present disclosure.

Having described the characteristics of a classical Reed-Solomon decoder, reference is now made to FIG. 2, which illustrates a Reed-Solomon decoder according to an embodiment of the present disclosure that takes advantage of soft-decision information to mark likely error symbols as erasure symbols. The Reed-Solomon decoder shown in FIG. 2 comprises two syndrome formers and two BM decoder engines, in a Duality Reed-Solomon decoder 200.

The Duality Reed-Solomon decoder 200 comprises a first syndrome former 210 and a second syndrome former 211, a first BM decoder 220 and a second BM decoder 221, an error correction unit 230, erasure location selector 240, a BM selector 250, and a MUX 260.

The Duality Reed-Solomon decoder 200 receives an input codeword comprising input symbols 101, and symbol metrics of goodness 203. The erasure location selector 240 generates erasure locations 242 based on the received symbol metrics of goodness 203. In an embodiment, the erasure location selector 240 selects the erasure locations 242 based on the Euclidian distance between the input symbol 201 and its nearest correct symbol.

The first syndrome former 210 generates first syndrome values 212 from the input symbols 201. The erasure location selector 240 provides the erasure locations 242 to the second syndrome former 211. The second syndrome former generates second syndrome values 213 from the input symbols 201 and the erasure locations 242. The second syndrome former 211 modifies the received codeword by filling with zeros the input symbols 201 that have been marked by the erasure locations 242. The second syndrome former 211 generates the second syndrome values 213 in the classical way using the equations discussed above with respect to FIG. 1 but with zeros filled in the erased symbols. The second syndrome values 213 differ from the first syndrome values 212 such that decoding the second syndrome values 213 and the first syndrome values 212 will generate different error locations.

The first syndrome former 210 provides the first syndrome values 212 to the first BM decoder 220 and the second syndrome former 211 provides the second syndrome values 213 to the second BM decoder 221.

The first BM decoder 220 decodes the first syndrome values 212 to identify the first error locations 222 and the second BM decoder 221 decodes the second syndrome values to identify the second error locations 223. The first BM decoder 220 and the second BM decoder 221 each provide a first and second uncorrectable indicator 251, 252 to the BM selector 250. The first and second BM decoders 223, 221 decode the first and second syndrome values 212, 213 according to the same steps discussed above with respect to FIG. 1.

The BM selector 250 selects one of the first and second BM decoders 220, 221 and provides the identifier of the selected BM decoder to the MUX 260. In an embodiment, the BM selector 250 selects the first BM decoder 220 if the first BM decoder 220 provides a negative uncorrectable indicator 251 or the BM selector 250 selects the second BM decoder if the first BM decoder provides a positive uncorrectable indicator 251.

The MUX 260 provides the first error locations 222 to the error correction unit 230 if the first BM decoder 220 was selected, or the MUX 260 provides the second error locations 223 to the error correction unit 230 if the second BM decoder 221 was selected.

The error correction unit 230 calculates the error values and corrects the value of the symbols indicated by the error locations according to the magnitude of the error value. In an embodiment, the error correction unit 230 calculates the error values according to a method based on the Forney algorithm. The error correction unit outputs the corrected codeword comprising output symbols 202 at the output of the Duality Reed-Solomon decoder 200.

If the second BM decoder 221 was selected, the error correction unit 230 calculates the error values at the error locations and at the erasure locations 242. The error values at the error locations and the erasure locations 242 is calculated according to a method based on a modification of the Forney algorithm that is amended with the erasure locator polynomial. A key equation is created, $\Omega(x)=\Lambda(x)\Gamma(x)S(x)(\mod x^{2t})$, which is similar to the error evaluator polynomial described above, but with the addition of an erasure locator polynomial, $\Gamma(x)=\Pi(1-x\alpha^{j_i})$. The combined error/erasure locator polynomial, $\Phi(x)=\Lambda(x)\Gamma(x)$ is then used to calculate the error and erasure values at the locations of the errors and the erasures:

$$e_{i_k} = -\frac{n(X_k^{-1})}{\Phi t(X_{k_i}^{-1})} \text{ and } f_{j_k} = -\frac{n(Y_k^{-1})}{\Phi j(Y_{k_i}^{-1})}.$$

Figure 3:
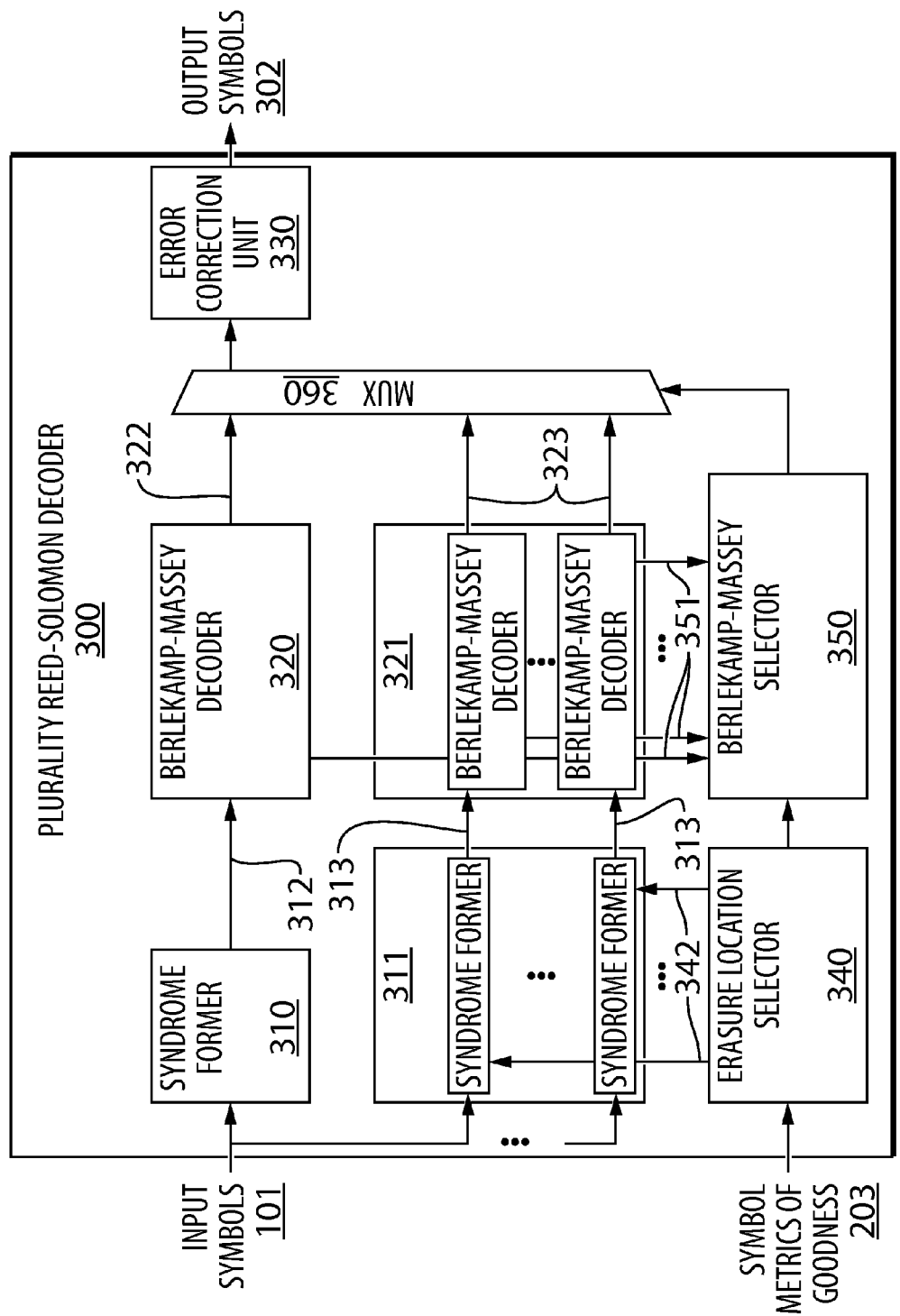
FIG. 3 illustrates a plurality Reed-Solomon decoder according to an embodiment of the present disclosure.

FIG. 3 illustrates a Reed-Solomon decoder according to another embodiment of the present disclosure that takes advantage of soft-decision information to mark likely error symbols as erasure symbols. The Reed-Solomon decoder shown in FIG. 2 comprises a plurality of additional syndrome formers 311 and a plurality of additional BM decoder engines 321, in a Plurality Reed-Solomon decoder 300.

The Plurality Reed-Solomon decoder 300 comprises a first syndrome former 310, a plurality of additional syndrome formers 311, a first BM decoder 320, a plurality of additional BM decoders 321, an error correction unit 230, an erasure location selector 240, a BM selector 250, and a MUX 260.

The Plurality Reed-Solomon decoder 300 receives an input codeword comprising input symbols 101, and symbol metrics of goodness 203. The erasure location selector 340 generates a plurality of erasure location vectors 342 based on the received symbol metrics of goodness 203. In an embodiment, the erasure location selector 340 selects the erasure locations comprising the plurality of erasure location vectors 342 based on the Euclidian distance between the input symbol 101 and its nearest correct symbol.

The first syndrome former 310 generates first syndrome values 312 from the input symbols 101. The erasure location selector 340 provides the plurality of erasure location vectors 342 to the plurality of additional syndrome formers 311. The plurality of additional syndrome formers 311 generates a plurality of syndrome values 313 from the input symbols 101 and the plurality of erasure location vectors 342. The plurality of additional syndrome formers 311 modifies the received codeword by filling with zeros the input symbols 101 that have been marked by the erasure locations. The plurality of additional syndrome formers 311 generates the plurality of syndrome values 313 in the classical way using the equations discussed above with respect to FIG. 1 but with zeros filled in for the erased symbols. The plurality of syndrome values 313 differ from the first syndrome values 312 such that decoding each set of the plurality of syndrome values 313 and the first syndrome values 312 will generate different error locations.

The first syndrome former 310 provides the first syndrome values 312 to the first BM decoder 320 and the plurality of additional syndrome formers 311 provides the plurality of syndrome values 313 to the plurality of additional BM decoders 321.

The first BM decoder 320 decodes the first syndrome values 312 to identify the first error locations 322 and the plurality of additional BM decoders 321 decodes the plurality of syndrome values 313 to identify the plurality of error locations 323. The first BM decoder 320 and the plurality of additional BM decoders 221 each provide an uncorrectable indicator, that together comprise a plurality of uncorrectable indicators 351, to the BM selector 350. The first BM decoder 320 and the plurality of additional BM decoders 321 decode the first syndrome values 312 and the plurality of syndrome values 313 according to the same steps discussed above with respect to FIG. 1.

In an embodiment, the BM selector 350 selects one of the first and plurality of additional BM decoders 320, 321 and provides the identifier of the selected BM decoder to the MUX 360. The MUX 360 provides the error locations 322, 323 of the selected BM decoder to the error correction unit 330.

The error correction unit 330 calculates the error values and corrects the value of the symbols indicated by the error locations according to the magnitude of the error value. In an embodiment, the error correction unit 330 calculates the error values according to a method based on the Forney algorithm. The error correction unit outputs the corrected codeword comprising output symbols 302 at the output of the Plurality Reed-Solomon decoder 300.

If one BM decoder of the plurality of additional BM decoders 321 was selected, the error correction unit 330 calculates the error values at the error locations and at the erasure locations associated with the selected BM decoder. The error values at the error locations and the error values at the erasure locations are calculated according to a method based on a modification of the Forney algorithm that is amended with the erasure locator polynomial. A key equation is created $\Omega(x) = \Lambda(x)\Gamma(x)S(x) (\mod x^{2r})$, which is similar to the error evaluator polynomial described above, but with the addition of an erasure locator polynomial, $\Gamma(x) = \Pi(1-x\alpha^{j_i})$. The combined error/erasure locator polynomial, $\Phi(x) = \Lambda(x)\Gamma(x)$ is then used to calculate the error and erasure values at the locations of the errors and the erasures:

$$e_{i_k} = -\frac{n(X_k^{-1})}{\Phi t(X_{k_i}^{-1})} \text{ and } f_{j_k} = -\frac{n(Y_k^{-1})}{\Phi j(Y_{k_i}^{-1})}.$$

In a further embodiment, the plurality of unique erasure location vectors 342 is ordered by an increasing number of erasures. The plurality of unique erasure location vectors 342 are provided in the same order to the plurality of additional syndrome formers 311. Thus, the syndrome formers are also ranked in order of the increasing number of erasures processed, and the generated plurality of syndromes 313 are also ranked in that order. The ordered plurality of syndromes 313 are provided to the plurality of additional BM decoders 321 in order so that the decoded error location polynomials 323 are also ordered. The increasing number of erasures at the erasure location selector 340 represents an increasing uncertainty of valid erasures. In order words, the soft-decision logic at the erasure location selector 340 makes an estimate of the most likely location or locations of erasures, and the more erasures that the erasure location selector marks, the more likely a valid symbol is incorrectly marked as an erasure symbol. Therefore, the decoded error location polynomials 343 are ultimately ranked in order of increasing likelihood of including an invalidly marked erasure. An invalidly marked erasure is not correctable; thus, the output codeword contains one or more error symbols. This condition is called a false correction.

On the other hand, consider a conservative erasure location vector comprising, for example, a single valid erasure location estimate. If this valid erasure marks one out of X error symbols of the input codeword, then the input codeword may or may not be correctable. If the number of non-erased symbols X−1 is small enough to satisfy the equality 2A+B≤N−k, where A=X−1 and B=1, then the codeword is correctable. However, if the number of non-erased symbols is larger than the chosen N−k Reed-Solomon code allows, then the codeword is not correctable. In many cases such as this one, when a codeword cannot be decoded, the codeword can be detected as an uncorrectable codeword. The embodiments of the present disclosure use this information to improve the BER of the soft-decision Reed-Solomon decoder.

Consider further a less conservative erasure location vector comprising, for example, two valid erasure location estimates: this would produce 2 erasures and X−2 errors. These two erasure estimates may bring the codeword below the correctable threshold. In this way, increasing the number erasures also increases the likelihood of correcting an input codeword with errored symbols. As discussed above, a BM decoder can in many cases detect an uncorrectable Reed-Solomon codeword; thus, the BM selector 350 of the present embodiment monitors which input codeword and erasure location vector combinations are not correctable at the first BM decoder 320 and the plurality of additional BM decoders 321 and selects a BM decoder having processed a number of erasures such that it generates a correctable output codeword. Due to the competing probabilities of a decreasing likelihood of uncorrectable codewords and an increasing likelihood of false corrections as the number of erasure locations increase, the selection of a BM decoder output corresponding to a number of erasures becomes an optimization problem. In essence, the BM selector is interested in selecting the BM decoder that generates output codewords that are neither uncorrectable nor false corrections.

Therefore, in an embodiment, the plurality of unique erasure location vectors 342 is ordered by the increasing number of erasures, causing the decoded error location polynomials 323 to be ranked in order of increasing likelihood of including an invalidly marked erasure. In this embodiment, the BM selector 350 selects a BM decoder corresponding to the first correctable error location polynomial from the plurality of ordered error location polynomials 323.

Figure 4:
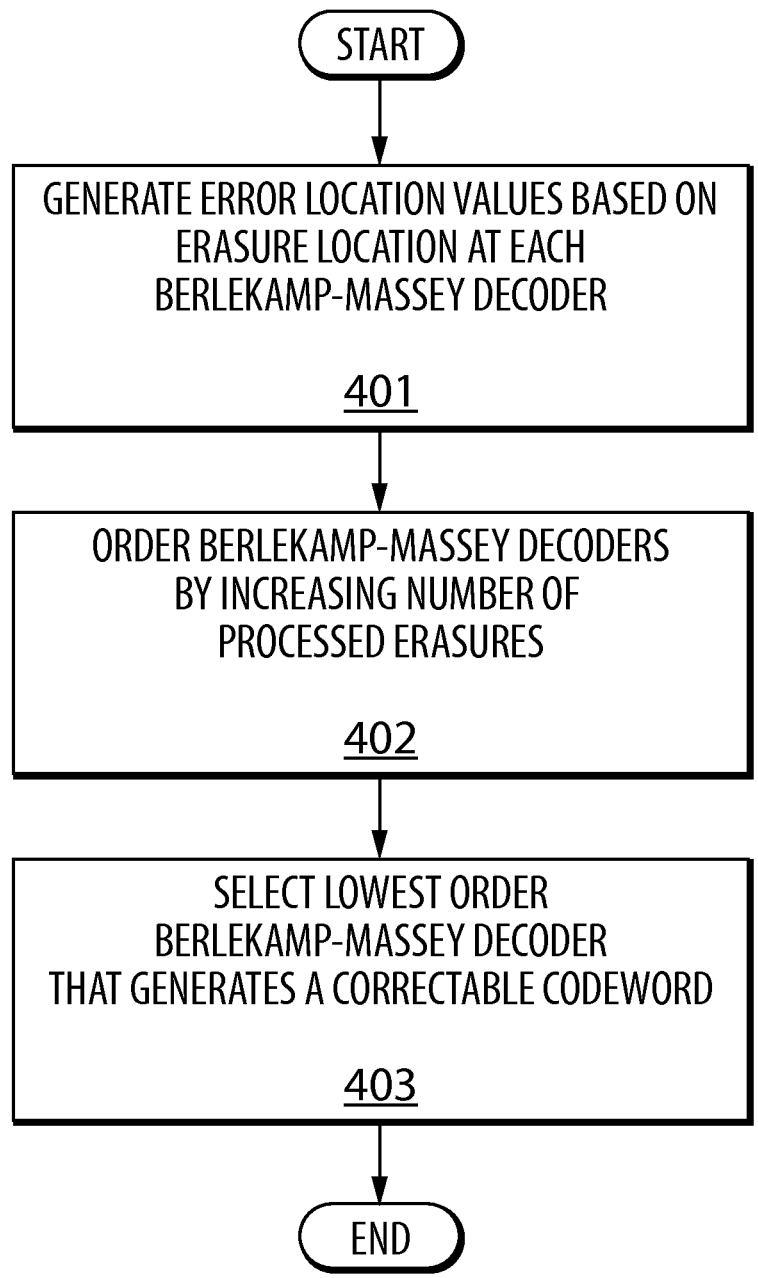
FIG. 4 illustrates a method of selecting a BM decoder according to an embodiment of the present disclosure.

FIG. 4 is a flow chart illustrating the method of soft-decision Reed-Solomon decoding of an example embodiment of the present disclosure. At step 401, the Reed-Solomon decoder generates error location values based on erasure locations at each BM decoder. At step 402, the decoder orders the BM decoders by increasing number of processed erasures. At step 403, the decoder selects the lowest order BM decoder that generates a correctable codeword.

Figure 5:
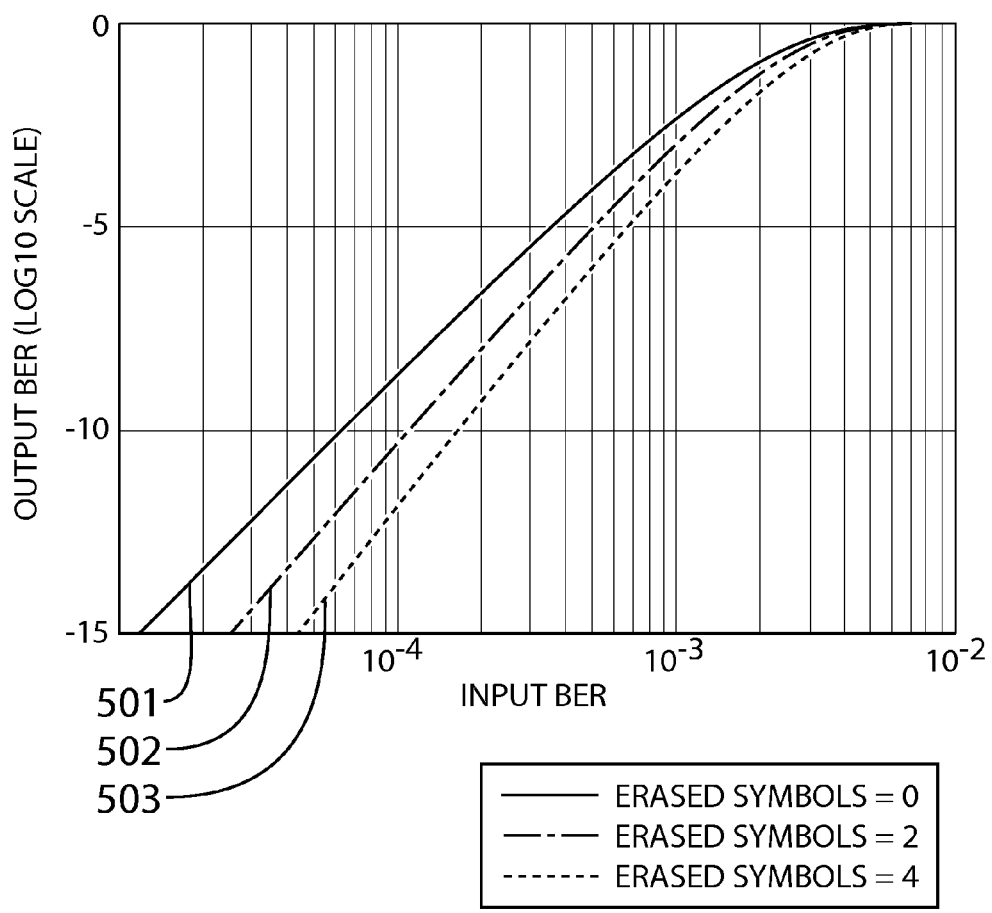
FIG. 5 illustrates a graphical representation of the performance of a duality Reed-Solomon decoder according to an embodiment of the present disclosure.

FIG. 5 is a graph that illustrates the BER performance improvement of a Duality Reed-Solomon decoder 200. The graph shows output to input BER curves for the Duality Reed-Solomon decoder 200 having erased a number of symbols. The curve denoted by zero erased symbols 501 is identical to the performance of a classical Reed-Solomon decoder. As FIG. 5 illustrates, increasing the number of erasures increases BER performance. The curve corresponding to 2 erased symbols 502 shows improved BER over curve 501; and the curve corresponding to 4 erased symbols 503 shows even more improved BER over curve 501 and curve 502.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

Embodiments of the disclosure can be represented as a hardware product implemented in an Integrated Circuit (IC), Programmable Gate Array, or some combination of Integrated Circuit(s), Programmable Gate Array(s), and Software. Those of ordinary skill in the art will appreciate that other functions can also be implemented on such Integrated Circuits or Programmable Gate Arrays.

The above-described embodiments are intended to be examples only. Alterations, modifications and variations can be effected to the particular embodiments by those of skill in the art without departing from the scope, which is defined solely by the claims appended hereto.

What is claimed is:

1. A method of decoding a Reed-Solomon code comprising:
   generating a plurality of syndromes based on received input symbols and based on a plurality of estimated erasure locations at a plurality of syndrome formers;
   decoding the plurality of syndromes at a plurality of Berlekamp-Massey (BM) decoders;
   selecting an output of one of the plurality of BM decoders to generate a selected decoder output;
   correcting the received input symbols based on the selected decoder output, at a single error correction unit; and
   ordering the plurality of BM decoders by an increasing number of processed erasures,
   wherein the selected decoder output corresponds to the output of a lowest order BM decoder, from the ordered plurality of BM decoders, that generates a correctable codeword.

2. The method of claim 1, further comprising generating the estimated erasure locations based on received symbol metrics at an erasure location selector.

3. The method of claim 1, further comprising generating the plurality of estimated erasure locations based on received symbol metrics at an erasure location selector.

4. The method of claim 2, wherein the symbol metrics are a measure of Euclidean distance between a symbol and its nearest correct symbol.

5. The method of claim 1, wherein correcting comprises correcting according to a Forney algorithm.

6. A Reed-Solomon decoder, comprising:
   a plurality of syndrome formers configured to produce a plurality of syndromes based on received input symbols and based on a plurality of estimated erasure locations;
   a plurality of Berlekamp-Massey (BM) decoders configured to receive the plurality of syndromes, the plurality of BM decoders being ordered by an increasing number of processed erasures, each of the plurality of syndrome formers being uniquely associated with one of the plurality of BM decoders;
   a single error correction unit associated with the plurality of BM decoders; and
   a decoder output selector configured to select either an output of the first BM decoder or an output of the second BM decoder and to provide a selected decoder output to the single error correction unit for correcting the received input symbols,
   wherein the decoder output selector comprises:
      logic for identifying the first BM decoder, the second BM decoder, or one the plurality of additional BM decoders, the logic being configured to select a lowest order BM decoder wherein the output of the lowest order BM decoder generates a correctable codeword; and
      a multiplexer for providing the output of the first BM decoder, the second BM decoder, or one the plurality of additional BM decoders, as the selected decoder output to the single error correction unit.

7. The decoder of claim 6, further comprising an erasure location selector associated with the second syndrome former and configured to provide the estimated erasure locations based on received symbol metrics.

8. The decoder of claim 6, wherein the decoder output selector comprises:
   logic for identifying either the first BM decoder or the second BM decoder; and
   a multiplexer for providing either the output of the first BM decoder or the output of the second BM decoder as the selected decoder output to the single error correction unit.

9. The decoder of claim 6, further comprising an erasure location selector associated with the plurality of additional syndrome formers and configured to provide a plurality of estimated erasure locations based on received symbol metrics.

10. The decoder of claim 7, wherein the symbol metrics received at the erasure location selector are a measure of Euclidean distance between a symbol and its nearest correct symbol.

11. The decoder of claim 6, wherein the single error correction unit comprises logic for correcting the received input symbols according to a Forney algorithm.

* * * * *